(12) United States Patent
Kido et al.

(10) Patent No.: US 12,427,580 B2
(45) Date of Patent: *Sep. 30, 2025

(54) CUTTING TOOL

(71) Applicant: Sumitomo Electric Hardmetal Corp., Itami (JP)

(72) Inventors: Yasuki Kido, Itami (JP); Susumu Okuno, Itami (JP); Masahito Hikiji, Itami (JP)

(73) Assignee: SUMITOMO ELECTRIC HARDMETAL CORP., Itami (JP)

( * ) Notice: Subject to any disclaimer, the term of this patent is extended or adjusted under 35 U.S.C. 154(b) by 502 days.

This patent is subject to a terminal disclaimer.

(21) Appl. No.: 17/776,609

(22) PCT Filed: Jun. 11, 2020

(86) PCT No.: PCT/JP2020/022993
§ 371 (c)(1),
(2) Date: May 13, 2022

(87) PCT Pub. No.: WO2021/250840
PCT Pub. Date: Dec. 16, 2021

(65) Prior Publication Data
US 2022/0402044 A1 Dec. 22, 2022

(51) Int. Cl.
*B23B 27/14* (2006.01)
*C30B 29/20* (2006.01)
*C23C 16/40* (2006.01)

(52) U.S. Cl.
CPC ........ *B23B 27/148* (2013.01); *B23B 2224/04* (2013.01); *B23B 2228/105* (2013.01); *C23C 16/403* (2013.01)

(58) Field of Classification Search
None
See application file for complete search history.

(56) References Cited

U.S. PATENT DOCUMENTS

2008/0187774 A1   8/2008   Ruppi
2011/0247465 A1   10/2011  Lind
(Continued)

FOREIGN PATENT DOCUMENTS

JP   2008-246664 A   10/2008
JP   2013-132717 A   7/2013
(Continued)

OTHER PUBLICATIONS

Translation—JP-2017042903-A; Idetani et al.; Mar. 2, 2017 (Year: 2017).*

(Continued)

*Primary Examiner* — Aaron Austin
(74) *Attorney, Agent, or Firm* — XSENSUS LLP (57) ABSTRACT

A cutting tool includes: a substrate; and a coating film disposed on the substrate, wherein the coating film includes an $\alpha$-$Al_2O_3$ layer, the $\alpha$-$Al_2O_3$ layer includes a plurality of $\alpha$-$Al_2O_3$ crystal grains, and has a TC(006) of more than 5 in texture coefficient TC(hkl), and an elastic modulus E1 of the $\alpha$-$Al_2O_3$ layer at a room temperature and an elastic modulus E2 of the $\alpha$-$Al_2O_3$ layer at 800° C. represent a relation of the following expression B-1:

$$0 < \{(E1-E2)/E1\} \times 100 < 10 \qquad \text{Expression B-1.}$$

14 Claims, 2 Drawing Sheets

(56) References Cited

U.S. PATENT DOCUMENTS

| | | | |
|---|---|---|---|
| 2014/0377024 A1 | 12/2014 | Sobana et al. | |
| 2015/0232978 A1 | 8/2015 | Schier | |
| 2017/0209936 A1 | 7/2017 | Kanaoka | |
| 2017/0268124 A1 | 9/2017 | Kanaoka | |
| 2018/0339415 A1* | 11/2018 | Yoshimura | B32B 15/04 |
| 2019/0160547 A1 | 5/2019 | Kanaoka | |
| 2022/0402043 A1 | 12/2022 | Kido et al. | |
| 2022/0402045 A1 | 12/2022 | Kido et al. | |

FOREIGN PATENT DOCUMENTS

| | | | | |
|---|---|---|---|---|
| JP | 2014-166657 | A | | 9/2014 |
| JP | 2015-530270 | A | | 10/2015 |
| JP | 2017-42903 | A | | 3/2017 |
| JP | 2017042903 | A | * | 3/2017 |
| JP | 2018-30193 | A | | 3/2018 |

OTHER PUBLICATIONS

Yoshioka et al., "Elastic Modulus of Ceramics at Elevated Temperature (Part 3)", Journal of the Ceramic Society of Japan, vol. 103, No. 1198, 1995, pp. 598-602.

Takahashi et al., "Young's Modulus of Ceramics at Elevated Temperature (Part 1)", Journal of the Ceramic Society of Japan, Japan, vol. 100, No. 1158, 1992, pp. 144-147.

Notice of Reasons for Refusal on Sep. 28, 2021, received for JP Application 2020-564765, 4 pages including English Translation.

Written Opinion mailed on Sep. 1, 2020, received for PCT Application PCT/JP2020/022993, Filed on Jun. 11, 2020, 8 pages including English Translation.

2007 Kyocera Cutting Tools., Kyocera Corp., The New Value Frontier, CERATIP, 2007, 6 pages.

Ishihara et al, "High Temperature Deformation of Fine Grained High Purity Alumina", J. Japan Inst. Metals, Japan, Japan Inst. Metals, vol. 62, No. 8, 1998, pp. 748-753.

Office Action issued Sep. 13, 2024 in U.S. Appl. No. 17/776,618.

Written Opinion mailed on Sep. 1, 2020, received for PCT Application PCT/JP2020/022994, Filed on Jun. 11, 2020, 8 pages including English Translation.

Notice of Allowance mailed Feb. 12, 2025 in related U.S. Appl. No. 17/776,608 (53 pages).

Notice of Allowance mailed Feb. 12, 2025 in related U.S. Appl. No. 17/776,618 (46 pages).

Office Action issued Sep. 13, 2024 in U.S. Appl. No. 17/776,608.

Written Opinion mailed on Sep. 1, 2020, received for PCT Application PCT/JP2020/022995, filed on Jun. 11, 2020, 8 pages including English Translation.

* cited by examiner

CUTTING TOOL

CROSS-REFERENCE TO RELATED APPLICATION

The present application is based on PCT filing PCT/JP2020/022993, filed Jun. 11, 2020, the entire contents of which are incorporated herein by reference. This application is also related to U.S. patent application Ser. No. 17/776,608, entitled Cutting Tool, filed on May 13, 2022, and U.S. patent application Ser. No. 17/776,618, entitled Cutting Tool, filed on May 13, 2022.

TECHNICAL FIELD

The present disclosure relates to a cutting tool.

BACKGROUND ART

A cutting tool having a coating film formed on a substrate has conventionally been used. Recently, techniques have been proposed for enhancing the performance of the cutting tool, such as a technique for improving the quality of the coating film by changing the crystallographic texture of $Al_2O_3$. For example, Japanese Patent Laying-Open No. 2008-246664 (PTL 1) proposes a cutting tool including an $\alpha\text{-}Al_2O_3$ layer having a (006) texture on a substrate composed of a cemented carbide.

CITATION LIST

Patent Literature

PTL 1: Japanese Patent Laying-Open No. 2008-246664

SUMMARY OF INVENTION

A cutting tool of the present disclosure is a cutting tool including:
  a substrate; and
  a coating film disposed on the substrate, wherein
  the coating film includes an $\alpha\text{-}Al_2O_3$ layer,
  the $\alpha\text{-}Al_2O_3$ layer includes a plurality of $\alpha\text{-}Al_2O_3$ crystal grains, and has a TC(006) of more than 5 in texture coefficient TC(hkl), and
  an elastic modulus E1 of the $\alpha\text{-}Al_2O_3$ layer at a room temperature and an elastic modulus E2 of the $\alpha\text{-}Al_2O_3$ layer at 800° C. represent a relation of the following expression B-1:

$$0 < \{(E1-E2)/E1\} \times 100 < 10 \qquad \text{Expression B-1.}$$

DETAILED DESCRIPTION

Problem to be Solved by the Present Disclosure

In recent years, a cutting tool having a long tool life has been required even in a more efficient cutting process. Particularly, a tool having a long tool life has been required even in high-speed light interruption processing of high-carbon chromium steel.

Thus, the present disclosure has an object to provide a tool having a long tool life particularly even in high-speed light interruption processing of high-carbon chromium steel.

Advantageous Effect of the Present Disclosure

The cutting tool of the present disclosure can have a long tool life particularly even in high-speed light interruption processing of high-carbon chromium steel.

DESCRIPTION OF EMBODIMENTS

First, embodiments of the present disclosure are listed and described.
(1) A cutting tool of the present disclosure is a cutting tool including:
  a substrate; and
  a coating film disposed on the substrate, wherein
  the coating film includes an $\alpha\text{-}Al_2O_3$ layer,
  the $\alpha\text{-}Al_2O_3$ layer includes a plurality of $\alpha\text{-}Al_2O_3$ crystal grains, and has a TC(006) of more than 5 in texture coefficient TC(hkl), and
  an elastic modulus E1 of the $\alpha\text{-}Al_2O_3$ layer at a room temperature and an elastic modulus E2 of the $\alpha\text{-}Al_2O_3$ layer at 800° C. represent a relation of the following expression B-1:

$$0 < \{(E1-E2)/E1\} \times 100 < 10 \qquad \text{Expression B-1.}$$

The cutting tool of the present disclosure can have a long tool life particularly even in the high-speed light interruption processing of high-carbon chromium steel.
(2) The elastic modulus E1 and the elastic modulus E2 preferably represent a relation of the following expression B-2:

$$0 < \{(E1-E2)/E1\} \times 100 < 8 \qquad \text{Expression B-2.}$$

This leads to a further improved tool life of the cutting tool.
(3) The TC(006) is preferably more than 5 and 8 or less. Thus, the wear resistance of the cutting tool is improved, thereby further improving the tool life.
(4) The TC(006) is preferably more than 6 and 8 or less. Thus, the wear resistance of the cutting tool is improved, thereby further improving the tool life.
(5) An average film thickness of the $\alpha\text{-}Al_2O_3$ layer is preferably 2 μm or more and 15 μm or less. This leads to a further improved tool life of the cutting tool.

Details of Embodiments of the Present Disclosure

A specific example of a cutting tool of the present disclosure will be described below with reference to figures. The same reference characters indicate the same or equivalent portions in the figures of the present disclosure. Further, a relation of such a dimension as a length, a width, a thickness, or a depth is modified as appropriate for clarity and brevity of the figures and does not necessarily represent an actual dimensional relation.

In the present specification, the expression "A to B" represents a range of lower to upper limits (i.e., A or more and B or less). When no unit is indicated for A and a unit is indicated only for B, the unit of A is the same as the unit of B.

When a compound or the like is expressed by a chemical formula in the present specification and an atomic ratio is not particularly limited, it is assumed that all the conventionally known atomic ratios are included. The atomic ratio should not be necessarily limited only to one in the stoichiometric range. For example, when "TiCN" is described, the atomic ratio of the TiCN includes all the conventionally known atomic ratios. Moreover, in the present embodiment, a metal element such as Ti or Al and a non-metal element such as N (nitrogen), O (oxygen), or C (carbon) does not need to necessarily constitute a stoichiometric composition.

First Embodiment: Cutting Tool

A cutting tool of the present disclosure is a cutting tool including: a substrate; and a coating film disposed on the substrate, wherein the coating film includes an $\alpha\text{-}Al_2O_3$ layer, the $\alpha\text{-}Al_2O_3$ layer includes a plurality of $\alpha\text{-}Al_2O_3$ crystal grains, and has a TC(006) of more than 5 in texture coefficient TC(hkl), and an elastic modulus E1 of the $\alpha\text{-}Al_2O_3$ layer at a room temperature and an elastic modulus E2 of the $\alpha\text{-}Al_2O_3$ layer at 800° C. represent a relation of the following expression B-1:

$$0 < \{(E1-E2)E1\} \times 100 < 10 \quad \text{Expression B-1.}$$

The cutting tool of the present disclosure can have a long tool life particularly even in the high-speed light interruption processing of high-carbon chromium steel. A reason for this is unknown, but is presumed as described in (i) and (ii) below.

(i) In the cutting tool of the present disclosure, the value of the TC(006) of the $\alpha\text{-}Al_2O_3$ layer is more than 5. Accordingly, fine film chipping and wear are less likely to occur in the $\alpha\text{-}Al_2O_3$ layer, and the $\alpha\text{-}Al_2O_3$ layer can have excellent wear resistance particularly even under a high temperature condition of the high-speed light interruption processing of high-carbon chromium steel. Thus, the cutting tool can have along tool life. It should be noted that details of the TC(006) of the $\alpha\text{-}Al_2O_3$ layer will be described later.

(ii) In the cutting tool of the present disclosure, elastic modulus E1 (hereinafter, also referred to as "room temperature elastic modulus E1") of the $\alpha\text{-}Al_2O_3$ layer at the room temperature and elastic modulus E2 (hereinafter, also referred to as "high temperature elastic modulus E2") of the $\alpha\text{-}Al_2O_3$ layer at 800° C. represent the relation of the following expression B-1:

$$0 < \{(E1-E2)E1\} \times 100 < 10 \quad \text{Expression B-1.}$$

Expression B-1 indicates that a ratio of decrease of high temperature elastic modulus E2 of the $\alpha\text{-}Al_2O_3$ layer with respect to room temperature elastic modulus E1 is less than 10%. That is, it is indicated that when room temperature elastic modulus E1 and high temperature elastic modulus E2 of the $\alpha\text{-}Al_2O_3$ layer satisfy expression B-1, the $\alpha\text{-}Al_2O_3$ layer maintains a high elastic modulus even at a high temperature. Therefore, the cutting tool having the $\alpha\text{-}Al_2O_3$ layer can have excellent breakage resistance, excellent strength, and long tool life particularly even under the high temperature condition of the high-speed light interruption processing of high-carbon chromium steel.

It should be noted that in the current technology, the morphology of the $\alpha\text{-}Al_2O_3$ layer at 800° C. cannot be analyzed to define its structure. Therefore, as a result of diligent study, the present inventors defined the present disclosure by defining the relation between room temperature elastic modulus E1 and high temperature elastic modulus E2 of the $\alpha\text{-}Al_2O_3$ layer.

<Configuration of Cutting Tool>

Figure 1:
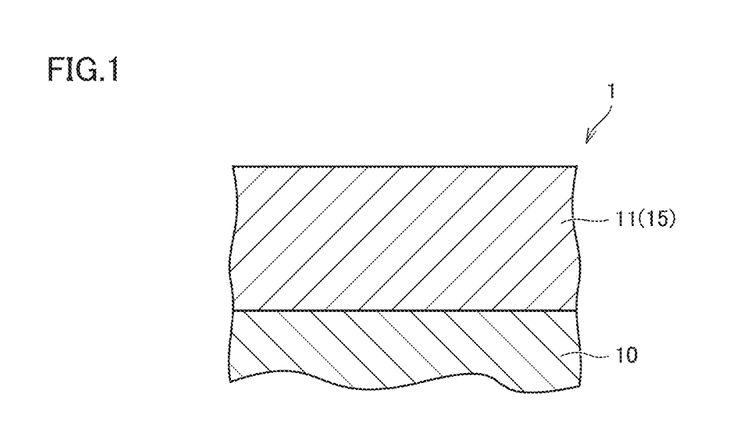
FIG. 1 is a diagram illustrating a representative exemplary configuration of a cutting tool according to a first embodiment.

As shown in FIG. 1, a cutting tool 1 of the present embodiment includes: a substrate 10; and a coating film 15 disposed on substrate 10, wherein coating film 15 includes an $\alpha\text{-}Al_2O_3$ layer 11. Coating film 15 preferably coats the entire surface of the substrate. However, a coating film that does not coat a portion of the substrate and a coating film having a partially different configuration are not deviated from the scope of the present disclosure.

Figure 2:
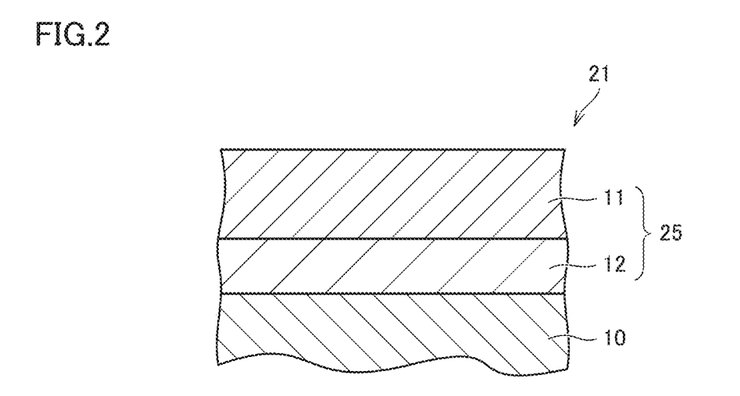
FIG. 2 is a diagram illustrating another exemplary configuration of the cutting tool according to the first embodiment.

Coating film 15 may include other layer(s) in addition to $\alpha\text{-}Al_2O_3$ layer 11. For example, as shown in FIG. 2, a coating film 25 may further include an underlying layer 12 disposed between substrate 10 and $\alpha\text{-}Al_2O_3$ layer 11.

Figure 3:
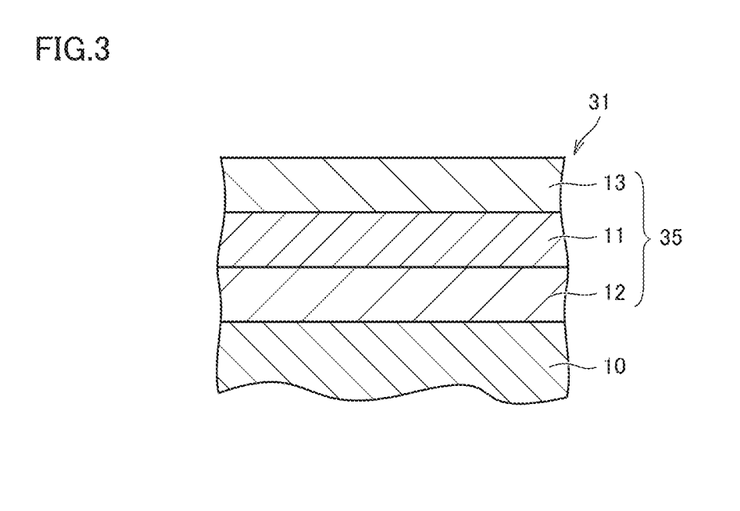
FIG. 3 is a diagram illustrating another exemplary configuration of the cutting tool according to the first embodiment.

As shown in FIG. 3, a coating film 35 may further include a surface layer 13 disposed on $\alpha\text{-}Al_2O_3$ layer 11.

Figure 4:
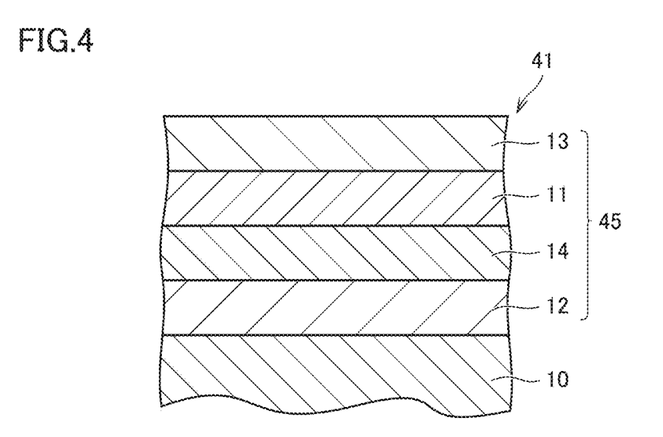
FIG. 4 is a diagram illustrating another exemplary configuration of the cutting tool according to the first embodiment.

As shown in FIG. 4, a coating film 45 may further include an intermediate layer 14 disposed between underlying layer 12 and $\alpha\text{-}Al_2O_3$ layer 11.

<Application of Cutting Tool>

Examples of the cutting tool of the present disclosure include a drill, an end mill (for example, a ball end mill), an indexable cutting insert for drill, an indexable cutting insert for end mill, an indexable cutting insert for milling, an indexable cutting insert for turning, a metal saw, a gear cutting tool, a reamer, a tap, and the like.

<Coating Film>

The coating film includes the $\alpha\text{-}Al_2O_3$ layer. For example, the coating film can be constituted of a plurality of layers that include one or more $\alpha\text{-}Al_2O_3$ layers and that further includes the other layer(s).

Examples of the other layer(s) include the underlying layer, the surface layer, the intermediate layer, and the like. More specifically, the examples of the other layer(s) include a TiCNO layer or a TiBN layer, a TiC layer, a TiN layer, a TiAlN layer, a TiSiN layer, an AlCrN layer, a TiAlSiN layer, a TiAlNO layer, an AlCrSiCN layer, a TiCN layer, a TiSiC layer, a CrSiN layer, an AlTiSiCO layer, a TiSiCN layer, and the like.

The average thickness of the whole of the coating film is preferably 3 µm or more and 35 µm or less. Thus, the coating film can have excellent wear resistance and detachment resistance. The average thickness of the whole of the coating film is more preferably 5 µm or more and 20 µm or less.

The thickness of the coating film is measured, for example, by obtaining a cross sectional sample parallel to the normal direction of the surface of the substrate and by observing the sample using a scanning transmission electron microscope (STEM).

Examples of the scanning transmission electron microscope include JEM-2100F (trademark) provided by JEOL.

In the present specification, the term "thickness" refers to an average thickness. Specifically, an observation magnification for the cross sectional sample is set to 5000× to 10000×, an observation area is set to 100 to 500 µm², thicknesses at 10 positions in one visual field are measured, and the average value of the thicknesses is defined as the "thickness". The thickness and average thickness of each of below-described layers are also measured and calculated in the same manner.

<α-Al$_2$O$_3$ Layer>
(Configuration of α-Al$_2$O$_3$ Layer)

In the present disclosure, the α-Al$_2$O$_3$ layer is a layer including a plurality of α-Al$_2$O$_3$ (aluminum oxide having an α type crystal structure) crystal grains. That is, the α-Al$_2$O$_3$ layer is constituted of polycrystalline α-Al$_2$O$_3$. The average grain size of the α-Al$_2$O$_3$ crystal grains is preferably 100 to 2000 nm.

(TC(006))

In the present disclosure, the α-Al$_2$O$_3$ layer has a TC(006) of more than 5 in texture coefficient TC(hkl) represented by the following expression (1):

$$TC(hkl) = \frac{I(hkl)}{I_0(hkl)} \left\{ \frac{1}{n} \sum_{1}^{n} \frac{I(hkl)}{I_0(hkl)} \right\}^{-1} \quad (1)$$

In the expression (1), I(hkl) represents an x-ray diffraction intensity of a (hkl) reflection plane, and I$_0$(hkl) represents a standard intensity according to PDF card No. 00-010-0173 of the ICDD. In the expression (1), n represents the number of reflections used for the calculation and is eight in the present embodiment. (hkl) planes used for reflection are (012), (104), (110), (006), (113), (024), (116), and (300).

ICDD (registered trademark) is an abbreviation for International Centre for Diffraction Data. PDF (registered trademark) is an abbreviation for Powder Diffraction File.

The TC(006) of the α-Al$_2$O$_3$ layer in the present embodiment can be expressed by the following expression (2).

$$TC(006) = \frac{I(006)}{I_o(006)} \left\{ \frac{1}{8} \sum_{1}^{8} \frac{I(hkl)}{I_o(hkl)} \right\}^{-1} \quad (2)$$

Therefore, "TC(006) of more than 5 in texture coefficient TC(hkl)" means that a numerical value given by the above expression (2) which is determined by substituting TC(006) in the expression (1) is more than 5. In the α-Al$_2$O$_3$ layer in which the value of TC(006) is more than 5, fine film chipping and wear are less likely to occur, and the α-Al$_2$O$_3$ layer can have excellent wear resistance particularly even under the high temperature condition of the high-speed light interruption processing of high-carbon chromium steel. Therefore, the cutting tool can have a long tool life.

The value of TC(006) is preferably more than 6 and more preferably more than 7. A greater value of TC(006) enables effective improvement of the wear resistance. While the upper limit of the value of TC(006) is not limited, the upper limit may be 8 or less since the number of reflection planes used for the calculation is 8. The value of TC(006) can be more than 5 and 8 or less, more than 6 and 8 or less, or more than 7 and 8 or less.

This TC(hkl) can be measured through an analysis by means of an x-ray diffractometer. TC(hkl) can for example be measured by means of SmartLab (registered trademark) manufactured by Rigaku Corporation (scanning speed: 21.7°/min, step: 0.01°, scanning range: 15 to 140°) under the following conditions. It should be noted that the result of measurement of the TC(hkl) by means of the x-ray diffractometer is herein referred to as "XRD result."

Characteristic x-ray: Cu-Kα
tube voltage: 45 kV
tube current: 200 mA
filter: multilayer mirror
optical system: focusing method
x-ray diffraction method: θ-2θ method When using the x-ray diffractometer, x rays are applied to the flank face of the cutting tool. Usually the rake face is formed to be uneven while the flank face is flat, and therefore, in order to eliminate disturbance factors, the x rays are preferably applied to the flank face. Particularly, the x rays are applied to portions of the flank face in a range of about 2 to 4 mm from the cutting edge ridgeline portion. Accordingly, reproducibility of the result becomes high.

(Elastic Modulus)

In the present disclosure, elastic modulus E1 of the α-Al$_2$O$_3$ layer at the room temperature and elastic modulus E2 of the α-Al$_2$O$_3$ layer at 800° C. represent the relation of the following expression B-1:

$$0 < \{(E1-E2)/E1\} \times 100 < 10 \quad \text{Expression B-1.}$$

Expression B-1 indicates that a ratio of decrease of high temperature elastic modulus E2 of the α-Al$_2$O$_3$ layer with respect to room temperature elastic modulus E1 is less than 10%. That is, it is indicated that when room temperature elastic modulus E1 and high temperature elastic modulus E2 of the α-Al$_2$O$_3$ layer satisfy expression B-1, the α-Al$_2$O$_3$ layer maintains a high elastic modulus even at a high temperature. Therefore, the cutting tool having the α-Al$_2$O$_3$ layer can have excellent breakage resistance, excellent strength, and long tool life particularly even under the high temperature condition of the high-speed light interruption processing of high-carbon chromium steel.

Room temperature elastic modulus E1 and high temperature elastic modulus E2 preferably represent a relation of the following expression B-2.

$$0 < \{(E1-E2)/E1\} \times 100 < 8 \quad \text{Expression B-2.}$$

The lower limit of room temperature modulus E1 of the α-Al$_2$O$_3$ layer can be 300 GPa or more, 315 GPa or more, or 325 GPa or more. The upper limit of room temperature elastic modulus E1 is not particularly limited, but can be 400 GPa or less, 380 GPa or less, or 350 GPa or less, for example. Room temperature elastic modulus E1 can be 300 GPa or more and 400 GPa or less, 315 GPa or more and 380 GPa or less, or 325 GPa or more and 350 GPa or less.

The lower limit of high temperature elastic modulus E2 of the α-Al$_2$O$_3$ layer can be 280 GPa or more, 290 GPa or more, or 300 GPa or more. The upper limit of high temperature elastic modulus E2 is not particularly limited, but can be, for example, 350 GPa or less, 340 GPa or less, or 330 GPa or less. High temperature elastic modulus E2 can be 280 GPa or more and 350 GPa or less, 290 GPa or more and 340 GPa or less, or 300 GPa or more and 330 GPa or less.

Room temperature modulus E1 and high temperature modulus E2 of the α-Al$_2$O$_3$ layer can be measured as follows. First, mirror processing is performed onto an arbitrary surface of the tool by cross section polisher processing (CP processing).

When the coating film includes a layer (for example, surface layer) other than the α-Al$_2$O$_3$ layer on the surface side with respect to the α-Al$_2$O$_3$ layer, the mirror surface processing is performed until the α-Al$_2$O$_3$ layer is exposed. The processed surface is subjected to high temperature nanoindenter measurement (indentation test using the apparatus "TI980" provided by Hysitron).

Room temperature modulus E1 is measured by performing the indentation test onto the tool at the room temperature (25±5° C.). High temperature elastic modulus E2 is measured by heating a measurement chamber of the measurement apparatus to 800° C. in an argon (Ar) atmosphere and by performing the indentation test onto the tool in the atmosphere. In the indentation test, pressing is performed at a load of 8 mN for 2 seconds, holding is performed for 1 second in the pressed state, and the load is unloaded in 2 seconds. The indentation test is performed at 10 positions on the surface of the tool. In the present specification, the average value of the room temperature elastic moduli at the 10 positions is defined as room temperature elastic modulus E1 of the $\alpha$-$Al_2O_3$ layer. Likewise, the average value of the high temperature elastic moduli at the 10 positions is defined as high temperature elastic modulus E2 of the $\alpha$-$Al_2O_3$ layer.
(Thickness)

The average thickness of the $\alpha$-$Al_2O_3$ layer is preferably 2 μm or more and 15 μm or less. Thus, both wear resistance and chipping resistance can be attained. The lower limit of the average thickness of the $\alpha$-$Al_2O_3$ layer can be 2 μm or more, 3.5 μm or more, or 5 μm or more. The upper limit of the average thickness of the $\alpha$-$Al_2O_3$ layer can be 15 μm or less, 13 μm or less, or 11 μm or less. The average thickness of the $\alpha$-$Al_2O_3$ layer can be 2 μm or more and 15 μm or less, 3.5 μm or more and 13 μm or less, or 5 μm or more and 11 μm or less.

The thickness of the $\alpha$-$Al_2O_3$ layer can be confirmed by observing the cross sectional sample of the cutting tool using the scanning transmission electron microscope (STEM) or the like as described above.
<Other Layer(s)>

As described above, the coating film can include the other layer(s) in addition to the $\alpha$-$Al_2O_3$ layer. As shown in FIGS. 2 to 4, examples of the other layer(s) include underlying layer 12, surface layer 13, intermediate layer 14, and the like.
(Underlying Layer)

The underlying layer is disposed between the substrate and the $\alpha$-$Al_2O_3$ layer. The underlying layer can be, for example, a TiN layer. The TiN layer preferably has an average thickness of 0.1 μm or more and 20 μm or less. Thus, the coating film can have excellent wear resistance and breakage resistance.
(Surface Layer)

Preferably, any one of Ti (titanium) carbide, Ti nitride and Ti boride is a main component of the surface layer, for example. The surface layer is a layer disposed closest to the surface side in the coating film. It should be noted, however, that the surface layer may not be formed at the cutting edge ridgeline portion. For example, when the other layer(s) are not formed on the $\alpha$-$Al_2O_3$ layer, the surface layer is disposed directly on the $\alpha$-$Al_2O_3$ layer.

The expression "any one of Ti carbide, Ti nitride, and Ti boride is a main component" means that 90 mass % or more of any one of Ti carbide, Ti nitride, and Ti boride is included. It means that the surface layer preferably consists of any one of Ti carbide, Ti nitride, and Ti boride, besides inevitable impurities.

Among the Ti carbide, the Ti nitride, and the Ti boride, the Ti nitride (namely the compound expressed as TiN) is particularly preferable for use as the main component of the surface layer. Among these compounds, TiN assumes the most distinct color (assumes gold) and therefore has an advantage of making it easy to identify a corner (identify a used part) of a cutting insert after used for cutting. The surface layer preferably consists of a TiN layer.

The surface layer preferably has an average thickness of 0.05 μm or more and 1 μm or less. This leads to improved adhesion between the surface layer and an adjacent layer. The upper limit of the average thickness of the surface layer can be 0.8 μm or less or 0.6 μm or less. The lower limit of the average thickness can be 0.1 μm or more or 0.2 μm or more.

<Intermediate Layer>

The intermediate layer is disposed between the underlying layer and the $\alpha$-$Al_2O_3$ layer. The intermediate layer can be, for example, a TiCN layer. Since the TiCN layer is excellent in wear resistance, the coating film can be provided with more suitable wear resistance. The intermediate layer preferably has an average thickness of 1 μm or more and 20 μm or less.

Second Embodiment: Method of Manufacturing Cutting Tool

The cutting tool of the first embodiment can be manufactured by forming the coating film on the substrate by a chemical vapor deposition (CVD) method. When the other layer(s) than the $\alpha$-$Al_2O_3$ layer are formed in the coating film, the other layer(s) can be formed under conventionally known conditions using a chemical vapor deposition apparatus (hereinafter, also referred to as "CVD apparatus"). On the other hand, the $\alpha$-$Al_2O_3$ layer can be formed, for example, as described below. It should be noted that the cutting tool of the first embodiment is not limited to the one manufactured by the following manufacturing method, and may be manufactured by another manufacturing method.

For a source gas, $AlCl_3$, HCl, $CO_2$, $H_2S$, $N_2$, and $H_2$ are used. Blending amounts in the source gas are changed between a period of time in 30 minutes from the start of film formation (hereinafter, also referred to as "first half period") and a subsequent period of time after 30 minutes from the start of film formation (hereinafter, also referred to as "second half period"). Specifically, the blending amounts in the first half period are as follows: 1 to 6 volume/of $AlCl_3$; 5 to 10 volume % of HCl; 0.5 to 2 volume % of $CO_2$; 1 to 3 volume % of $H_2S$; 1 to 10 volume % of $N_2$; and a remainder of $H_2$. The blending amounts in the second half period are the same as the blending amounts in the first half period except that the blending amount of HCl is smaller than that in the first half period and is 2 to 7 volume % and the amount of $H_2$ is changed accordingly. That is, the content of HCl in the source gas in the second half period is made smaller than that in the first half period.

As described above, the source gas includes the mixed gas of $N_2$ and $H_2$ as a carrier gas. Thus, gas distribution in the CVD apparatus becomes excellent, with the result that the $\alpha$-$Al_2O_3$ layer of the present embodiment having a high elastic modulus even at a high temperature can be formed. This is newly found by the present inventors.

Film formation conditions for the $\alpha$-$Al_2O_3$ layer can be, for example, as follows: a temperature is 950 to 1050° C., a pressure is 1 to 5 kPa, and a gas flow rate (total amount of gases) is 50 to 100 L/min. The source gas can be introduced into the reaction container at an introduction rate of 1.7 to 3.5 m/sec.

[Clause 1]

In the cutting tool of the present disclosure, the TC(006) of the $\alpha$-$Al_2O_3$ layer is preferably more than 7 and 8 or less.

[Clause 2]

In the cutting tool of the present disclosure, the average thickness of the whole of the coating film is preferably 3 μm or more and 35 μm or less.

In the cutting tool of the present disclosure, the average thickness of the whole of the coating film is preferably 5 μm or more and 20 μm or less.

[Clause 3]

In the cutting tool of the present disclosure, room temperature elastic modulus E1 of the α-Al$_2$O$_3$ layer can be 300 GPa or more and 400 GPa or less.

In the cutting tool of the present disclosure, room temperature elastic modulus E1 of the α-Al$_2$O$_3$ layer can be 315 GPa or more and 380 GPa or less.

In the cutting tool of the present disclosure, room temperature elastic modulus E1 of the α-Al$_2$O$_3$ layer can be 325 GPa or more and 350 GPa or less.

[Clause 4]

In the cutting tool of the present disclosure, high temperature elastic modulus E2 of the α-Al$_2$O$_3$ layer can be 280 GPa or more and 350 GPa or less.

In the cutting tool of the present disclosure, high temperature elastic modulus E2 of the α-Al$_2$O$_3$ layer can be 290 GPa or more and 340 GPa or less.

In the cutting tool of the present disclosure, high temperature elastic modulus E2 of the α-Al$_2$O$_3$ layer can be 300 GPa or more and 330 GPa or less.

[Clause 5]

In the cutting tool of the present disclosure, the average thickness of the α-Al$_2$O$_3$ layer can be 2 μm or more and 15 μm or less.

In the cutting tool of the present disclosure, the average thickness of the α-Al$_2$O$_3$ layer can be 3.5 μm or more and 13 μm or less.

In the cutting tool of the present disclosure, the average thickness of the α-Al$_2$O$_3$ layer can be 5 μm or more and 11 μm or less.

[Clause 6]

In the cutting tool of the present disclosure, the coating film preferably includes the underlying layer disposed between the substrate and the α-Al$_2$O$_3$ layer.

The underlying layer preferably consists of a TiN layer.

The average thickness of the underlying layer is preferably 0.1 μm or more and 20 μm or less.

[Clause 7]

In the cutting tool of the present disclosure, the coating film preferably includes the surface layer disposed closest to the surface side of the coating film.

The surface layer preferably consists of a TiN layer.

The average thickness of the surface layer is preferably 0.05 μm or more and 1 μm or less.

[Clause 8]

In the cutting tool of the present disclosure, the coating film preferably includes the intermediate layer disposed between the underlying layer and the α-Al$_2$O$_3$ layer.

The intermediate layer preferably consists of a TiCN layer.

The average thickness of the intermediate layer is preferably 1 μm or more and 20 μm or less.

EXAMPLES

The following describes the present embodiment more specifically by way of examples. However, the present embodiment is not limited by these examples.

[Specimens 1 to 7]

<Preparation of Substrate>

Source material powders having blending compositions shown in Table 1 were uniformly mixed, were pressed and shaped into a predetermined shape, and were then sintered at 1300 to 1500° C. for 1 to 2 hours to obtain a substrate composed of a cemented carbide (model number CNMG120408N-GU provided by Sumitomo Electric Hard-Metal).

TABLE 1

| Blending Composition (Mass %) | | | | | |
|---|---|---|---|---|---|
| Co | TiC | Cr$_3$C$_2$ | NbC | TaC | WC |
| 7 | 2 | 0.3 | 1.5 | 0.5 | Remainder |

<Formation of Coating Film>

A coating film was formed on a surface of the substrate obtained as described above, thereby producing a cutting tool. Specifically, the substrate is set in a chemical vapor deposition apparatus to form the coating film on the substrate by the chemical vapor deposition method. The coating film includes a TiN layer (underlying layer), a TiCN layer (intermediate layer), an α-Al$_2$O$_3$ layer, and a TiN layer (surface layer).

(TiN Layer (Underlying Layer) and TiCN Layer (Intermediate Layer))

The TiN layer (underlying layer) and the TiCN layer (intermediate layer) were formed on the substrate in the above-described order. Film formation conditions for the TiN layer and the TiCN layer are shown in Table 2.

TABLE 2

| | | Film Formation Conditions | | |
|---|---|---|---|---|
| | Source Gas Composition (Volume %) | Pressure (kPa) | Temperature (° C.) | Total Amount of Gases (L/min) |
| TiN Layer (Underlying Layer) | TiCl$_4$ = 2%, N$_2$ = 39.7%, H$_2$ = Remainder | 35 | 910 | 75 |
| TiCN Layer (Intermediate Layer) | TiCl$_4$ = 2%, CH$_3$CN = 0.8%, C$_2$H$_4$ = 1.3%, H$_2$ = Remainder | 15 | 840 | 70 |
| TiN Layer (Surface Layer) | TiCl$_4$ = 0.8%, N$_2$ = 41%, H$_2$ = Remainder | 80 | 1000 | 55 |

For example, for the TiN layer (underlying layer), a source gas having a composition of 2 volume % of TiCl$_4$, 39.7 volume/of N$_2$, and a remainder of H$_2$ was used. The source gas was supplied to the chemical vapor deposition apparatus to perform the chemical vapor deposition method under conditions of a pressure of 35 kPa, a temperature of 910° C., and a flow rate (total amount of gases) of 75 L/min, thereby forming the TiN layer (underlying layer).

The "remainder" in Table 2 indicates that H$_2$ occupies the remainder of the source gas. The "total amount of gases" indicates a total volume flow rate introduced into the chemical vapor deposition apparatus per unit time, with a gas in a standard condition (0° C. and 1 atmospheric pressure) being defined as the ideal gas (also applicable to the α-Al$_2$O$_3$ layer in Table 3). A thickness of each layer was adjusted by adjusting as appropriate a time period for film formation (a rate of film formation of each layer was approximately from 0.5 to 2.0 μm/hour).

(Formation of α-Al$_2$O$_3$ Layer)

Next, the α-Al$_2$O$_3$ layer was formed on the TiCN layer. Film formation conditions for each of the specimens are shown in Table 3. In the formation of the α-Al$_2$O$_3$ layer, an introduction rate of the source gas was set to 2 m/sec, and a gas pipe for jetting the source gas was rotated at 2 rpm with the substrate being fixed.

TABLE 3

| Specimen No. | Source Gas Composition (Volume %) | | | | | | | | Film Formation Conditions | | |
| --- | --- | --- | --- | --- | --- | --- | --- | --- | --- | --- | --- |
| | $AlCl_3$ | HCl (After 30 Minutes from Start of Film Formation) | HCl (In 30 Minutes from Start of Film Formation) | $CO_2$ | $H_2S$ | $N_2$ | Ar | $H_2$ | Pressure (kPa) | Temperature (° C.) | Total Amount of Gases (L/min) |
| 1 | 3.6 | 6 | 8.5 | 1.4 | 2.1 | 4.5 | 0 | Remainder | 4 | 1000 | 80 |
| 2 | 2.9 | 4.1 | 6.5 | 1 | 1.5 | 4.5 | 0 | Remainder | 4 | 1000 | 80 |
| 3 | 2.3 | 2.9 | 6 | 1.3 | 2.4 | 4.5 | 0 | Remainder | 4 | 1000 | 80 |
| 4 | 4 | 5 | 7.2 | 1.2 | 2.2 | 5 | 0 | Remainder | 4 | 1000 | 80 |
| 5 | 4.5 | 5.1 | 4.2 | 2.4 | 3.7 | 5 | 0 | Remainder | 4 | 1000 | 80 |
| 6 | 3.7 | 5.3 | 2.9 | 2.1 | 3.9 | 3 | 0 | Remainder | 4 | 1000 | 80 |
| 7 | 7.8 | 2.5 | 4.7 | 2.8 | 3.5 | 4 | 0 | Remainder | 4 | 1000 | 80 |

For example, film formation conditions for specimen 1 are as follows. During a period of time in 30 minutes from the start of film formation of the $\alpha$-$Al_2O_3$ layer, a source gas was used which had a composition of 3.6 volume % of $AlCl_3$, 8.5 volume % of HCl, 1.4 volume % of $CO_2$, 2.1 volume % of $H_2S$, 4.5 volume % of $N_2$, and a remainder of $H_2$. During a subsequent period of time after 30 minutes from the start of film formation, a source gas was used which had the same composition as described above except that the amount of HCl in the source gas was set to 6 volume % and the amount of the remainder of $H_2$ was changed accordingly. The source gas was supplied to the chemical vapor deposition apparatus, and the chemical vapor deposition method was performed under conditions of a pressure of 4 kPa, a temperature of 1000° C., and a flow rate (total amount of gases) of 80 L/min, thereby forming an $\alpha$-$Al_2O_3$ layer.
(Formation of TiN Layer (Surface Layer))

Next, the TiN layer (surface layer) was formed on the $\alpha$-$Al_2O_3$ layer. Film formation conditions are as shown in Table 2.
<Configuration of Coating Film>

Table 4 shows a configuration of the coating film of each of the specimens. Regarding Table 4, the composition and thickness of each of the coating films were confirmed by a SEM-EDX (scanning electron microscope-energy dispersive x-ray spectroscopy).

TABLE 4

| Specimen No. | Composition of Coating Film (μm) | | | | |
| --- | --- | --- | --- | --- | --- |
| | TiN Layer (Underlying Layer) | TiCN Layer (Intermediate Layer) | $\alpha$-$Al_2O_3$ Layer | TiN Layer (Surface Layer) | Total Thickness of Coating Film (μm) |
| 1 | 0.4 | 9.8 | 6.4 | 0.4 | 17 |
| 2 | 0.4 | 10.2 | 5.9 | 0.6 | 17.1 |
| 3 | 0.7 | 9.6 | 6.6 | 0.5 | 17.4 |
| 4 | 0.3 | 10.2 | 6.5 | 0.6 | 17.6 |
| 5 | 0.5 | 10 | 6.3 | 0.6 | 17.4 |
| 6 | 0.8 | 9.6 | 6.3 | 0.5 | 17.2 |
| 7 | 0.4 | 9.8 | 6 | 0.4 | 16.6 |

For example, in the cutting tool of specimen 1, a TiN layer having a thickness of 0.4 μm and serving as the underlying layer, a TiCN layer having a thickness of 9.8 μm and serving as the intermediate layer, an $\alpha$-$Al_2O_3$ layer having a thickness of 6.4 μm, and a TiN layer having a thickness of 0.4 μm and serving as the surface layer are formed in the above-described order on the surface of the substrate as described in Table 1. The total thickness of the coating film of specimen 1 is 17 μm.

<Evaluation on $\alpha$-$Al_2O_3$ Layer>

In the $\alpha$-$Al_2O_3$ layer of each specimen, the TC(006), room temperature elastic modulus E1 and high temperature (800° C.) elastic modulus E2 were measured. Methods of measuring these are as described in the first embodiment, and therefore will not be described repeatedly.

For example, in specimen 1, E1 was 331 GPa and E2 was 308 GPa.

Further, the value of $\{(E1-E2)/E1\}\times 100$ was calculated based on room temperature elastic modulus E1 and high temperature elastic modulus E2. Results are shown in the columns "TC(006)" and "$\{(E1-E2)/E1\}\times 100$" in Table 5.

TABLE 5

| Specimen No. | Tc(006) | $\{(E1 - E2)/E1\} \times 100$ |
| --- | --- | --- |
| 1 | 5.4 | 7 |
| 2 | 5.4 | 7 |
| 3 | 6.7 | 6 |
| 4 | 6.7 | 7 |
| 5 | 5.6 | 19 |
| 6 | 6.7 | 11 |
| 7 | 4.5 | 9 |

<Cutting Test>

Each of the cutting tools obtained above was used to perform a cutting test under below-described cutting conditions so as to measure a cutting time until a Vb wear amount (flank wear amount) became 0.3 mm or a time until occurrence of breakage resulting from wear. Results are shown in Table 6. It is indicated that as the cutting time is longer, the tool life is longer.
(Cutting Conditions)

Workpiece: SUJ2 round bar with one notch
Processing: turning for outer diameter of round bar
Cutting rate vc: 350 m/min
Feeding rate f: 0.3 mm/rev
Depth of cut ap: 2.0 mm
Cutting fluid: none The cutting conditions correspond to the high-speed light interruption processing of high-carbon chromium steel.

TABLE 6

| Specimen No. | Tool Life (min) | Final State |
| --- | --- | --- |
| 1 | 10 | Breakage |
| 2 | 11 | Breakage |
| 3 | 16 | Breakage |
| 4 | 15 | Breakage |

TABLE 6-continued

| Specimen No. | Tool Life (min) | Final State |
|---|---|---|
| 5 | 3 | Breakage |
| 6 | 4 | Breakage |
| 7 | 5 | Wear |

<Analysis>

Each of the cutting tools of specimens 1 to 4 corresponds to an example of the present disclosure. Each of the cutting tools of specimens 5 to 7 corresponds to a comparative example. It was confirmed that the tool life in each of specimens 1 to 4 was longer than the tool life in each of specimens 5 to 7.

Among them, the tool life in each of specimens 3 and 4 was long. This is presumably due to the following reason: since the value of TC(006) is large, the wear resistance is further improved.

In each of specimens 5 and 6, the value of $\{(E1-E2)/E1\} \times 100$ is more than 10 and decrease in elastic modulus is large to cause decreased breakage resistance and strength, thus presumably resulting in the short tool life.

In specimen 7, the value of TC(006) is 5 or less and the wear resistance is decreased, thus presumably resulting in the short tool life.

Heretofore, the embodiments and examples of the present disclosure have been illustrated, but it has been initially expected to appropriately combine the configurations of the embodiments and examples and modify them in various manners.

The embodiments and examples disclosed herein are illustrative and non-restrictive in any respect. The scope of the present invention is defined by the terms of the claims, rather than the embodiments and examples described above, and is intended to include any modifications within the scope and meaning equivalent to the terms of the claims.

REFERENCE SIGNS LIST 1, 21, 31, 41: cutting tool; 10: substrate; 11: $\alpha$-Al$_2$O$_3$ layer; 12: underlying layer; 13: surface layer; 14: intermediate layer; 15, 25, 35, 45: coating film

The invention claimed is:

1. A cutting tool comprising:
a substrate; and
a coating film disposed on the substrate, wherein
the coating film includes an $\alpha$-Al$_2$O$_3$ layer,
the $\alpha$-Al$_2$O$_3$ layer includes a plurality of $\alpha$-Al$_2$O$_3$ crystal grains, and has a TC(006) of more than 5 in texture coefficient TC(hkl), and
an elastic modulus E1 of the $\alpha$-Al$_2$O$_3$ layer at a room temperature and an elastic modulus E2 of the $\alpha$-Al$_2$O$_3$ layer at 800° C. represent a relation of the following expression B-1:

$$0<\{(E1-E2)/E1\}\times 100<10 \qquad \text{Expression B-1.}$$

2. The cutting tool according to claim 1, wherein the elastic modulus E1 and the elastic modulus E2 represent a relation of the following expression B-2:

$$0<\{(E1-E2)/E1\}\times 100<8 \qquad \text{Expression B-2.}$$

3. The cutting tool according to claim 1, wherein the TC(006) is more than 5 and 8 or less.

4. The cutting tool according to claim 2, wherein the TC(006) is more than 5 and 8 or less.

5. The cutting tool according to claim 1, wherein the TC(006) is more than 6 and 8 or less.

6. The cutting tool according to claim 2, wherein the TC(006) is more than 6 and 8 or less.

7. The cutting tool according to claim 1, wherein an average thickness of the $\alpha$-Al$_2$O$_3$ layer is 2 μm or more and 15 μm or less.

8. The cutting tool according to claim 2, wherein an average thickness of the $\alpha$-Al$_2$O$_3$ layer is 2 μm or more and 15 μm or less.

9. The cutting tool according to claim 3, wherein an average thickness of the $\alpha$-Al$_2$O$_3$ layer is 2 μm or more and 15 μm or less.

10. The cutting tool according to claim 4, wherein an average thickness of the $\alpha$-Al$_2$O$_3$ layer is 2 μm or more and 15 μm or less.

11. The cutting tool according to claim 5, wherein an average thickness of the $\alpha$-Al$_2$O$_3$ layer is 2 μm or more and 15 μm or less.

12. The cutting tool according to claim 6, wherein an average thickness of the $\alpha$-Al$_2$O$_3$ layer is 2 μm or more and 15 μm or less.

13. The cutting tool according to claim 1, wherein the $\alpha$-Al$_2$O$_3$ layer is prepared by performing chemical vapor deposition with a source gas in which:
a concentration of HCl in the source gas during a first period of time of up to 30 minutes from a start of film formation is 5 volume % to 10 volume %, and
the concentration of HCl in the source gas during a second period of time after 30 minutes from the start of film formation is smaller than the concentration of HCl in the source gas during the first period of time, and is 2 volume % to 7 volume %.

14. The cutting tool according to claim 1, wherein the $\alpha$-Al$_2$O$_3$ layer is prepared by performing chemical vapor deposition in which a carrier gas includes a mixed gas of N$_2$ and H$_2$.

* * * * *